Feb. 21, 1967 D. C. BAILEY 3,305,728
FLIP-FLOP TRIGGERED BY THE TRAILING EDGE
OF THE TRIGGERING CLOCK PULSE
Filed Feb. 5, 1963 2 Sheets-Sheet 1

INVENTOR:
Dean C. Bailey
By Mueller & Aichele
Attorney

INVENTOR:
Dean C. Bailey
By Mueller & Aichele
Attorney

United States Patent Office 3,305,728

Patented Feb. 21, 1967

3,305,728

FLIP-FLOP TRIGGERED BY THE TRAILING EDGE OF THE TRIGGERING CLOCK PULSE

Dean C. Bailey, Scottsdale, Ariz., assignor to Motorola, Inc., Chicago, Ill., a corporation of Illinois Filed Feb. 5, 1963, Ser. No. 256,369
10 Claims. (Cl. 307—88.5)

Figure 1:
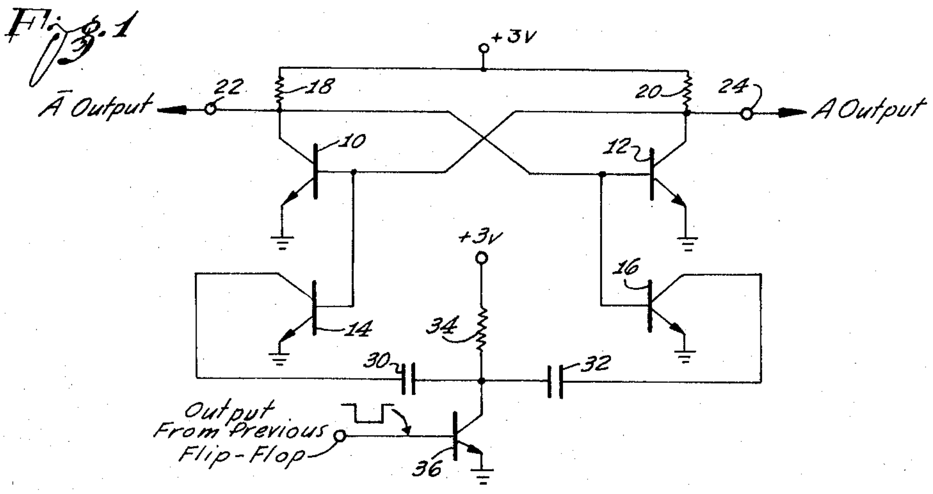

The present invention relates to bi-stable, relaxation oscillator type multivibrator circuits; and it relates more particularly to such circuits of the transistorized type.

The bi-stable multivibrator, usually referred to as a "flip-flop," has gained wide acceptance in the present-day electronic art, especially in the field of electronic digital computers, data processors and the like. Such flip-flops are used in digital computers, and in similar mechanisms and apparatus, for switching, gating, counting and for other purposes.

The usual flip-flop is an Eccles-Jordan relaxation oscillator, and it may be transistorized to include a pair of transistors with cross-coupling networks between the input and output electrodes of the transistors to provide the desired bi-stable characteristics.

The two stable states of the usual flip-flop are generally referred to as the "set" and the "reset" states, respectively. The flip-flop is triggered to its "set" state by an input signal applied to a "set" input terminal; and the flip-flop is triggered to its "reset" state by an input signal applied to a "reset" input terminal.

In some applications, appropriate "steering" networks are used in the input circuit of the flip-flop so that successive clock pulses applied to a single input terminal may trigger the flip-flop between its set and reset states for counting purposes and the like.

In order to reduce and standardize the number of components required in the usual flip-flop, the present trend has been to the technique of circuit integration and direct coupled transistor logic. In fabricating a typical integrated circuit, a number of diffused P–N junctions are formed on a substrate of intrinsic semi-conductor material, and these junctions are used to provide the diodes, transistors, and other circuit elements required in the integrated circuit. Circuit conductors, resistors and capacitors are also provided on the substrate in accordance with known circuit integration techniques.

One of the chief problems in fabricating direct coupled transistor logic flip-flops by integrated circuit techniques is the relative complexity encountered in the provision of simple flip-flop binary counters, static registers and the like. This is because of the signal racing problem in the usual counter, shift register, or the like, in which the successive stages are to be triggered successively, and in which there is a tendency for two or more of the stages to be triggered in the same clock time by the applied clock pulses.

The usual prior art attack on the signal racing problem mentioned in the preceding paragraph has been to incorporate multi-phase trains of clock pulses so as to provide the necessary logic delays for the successive triggering of the different stages, and to incorporate direct coupled transistor "nor" logic in the counter or shift register. This additional logic is used to assure that each stage in the prior art counter or register will be triggered in the proper sequence.

However, such an approach results in undue complexity in the over-all circuit. For example, a prior art single bit counter using this technique requires, in a particular example, twenty-eight direct current transistor logic type transistor stages. In the particular prior art counter, for example, a pull-over transistor is used to provide the set and reset inputs to each transistor stage, and the clock pulses are "anded" by the use of three direct coupled transistor logic "nor" gates preceding each input.

The system of the present invention simplifies the clocking system of the direct coupled transistor logic type of flip-flop by utilizing a trailing edge triggering circuit. With the system to be described, a single-phase train of clock pulses can be used, and the use of multi-phase trains of clock pulses and the extraneous stages required in the prior art systems can be eliminated. The use of trailing edge triggering circuitry assures that any particular stage to be triggered is so triggered by the trailing edge of the triggering clock pulse; then, the next stage is conditioned for triggering only after the termination of the preceding clock pulse and there is no tendency for it to be triggered concurrently with the preceding stage.

An object of the present invention, therefore, is to provide an improved transistorized flip-flop which is particularly suited for use in counters, shift registers, and the like, and which can be so used without the necessity for multi-phased trains of triggering pulses, extraneous gates or other logic circuitry.

Another object of the invention is to provide such an improved flip-flop which particularly lends itself to direct coupled transistor logic integrated circuit construction.

Yet another object of the invention is to provide an improved flip-flop which can be connected into a multi-stage counter or shift register by merely connecting its output to the input of a like flip-flop, and by applying a common train of clock pulses to all the flip-flops.

A feature of the invention is the provision of an improved flip-flop which utilizes, in general, trailing edge triggering of the triggering clock pulses, so that the triggering of any particular stage in the counter is not effectuated until the preceding stages have assumed their proper configuration.

Another feature of the invention is the provision of such an improved flip-flop which may be constructed to utilize integrated circuit, fused junctions to provide the required elements for the trailing edge triggering by the triggering clock pulses.

Figure 2:
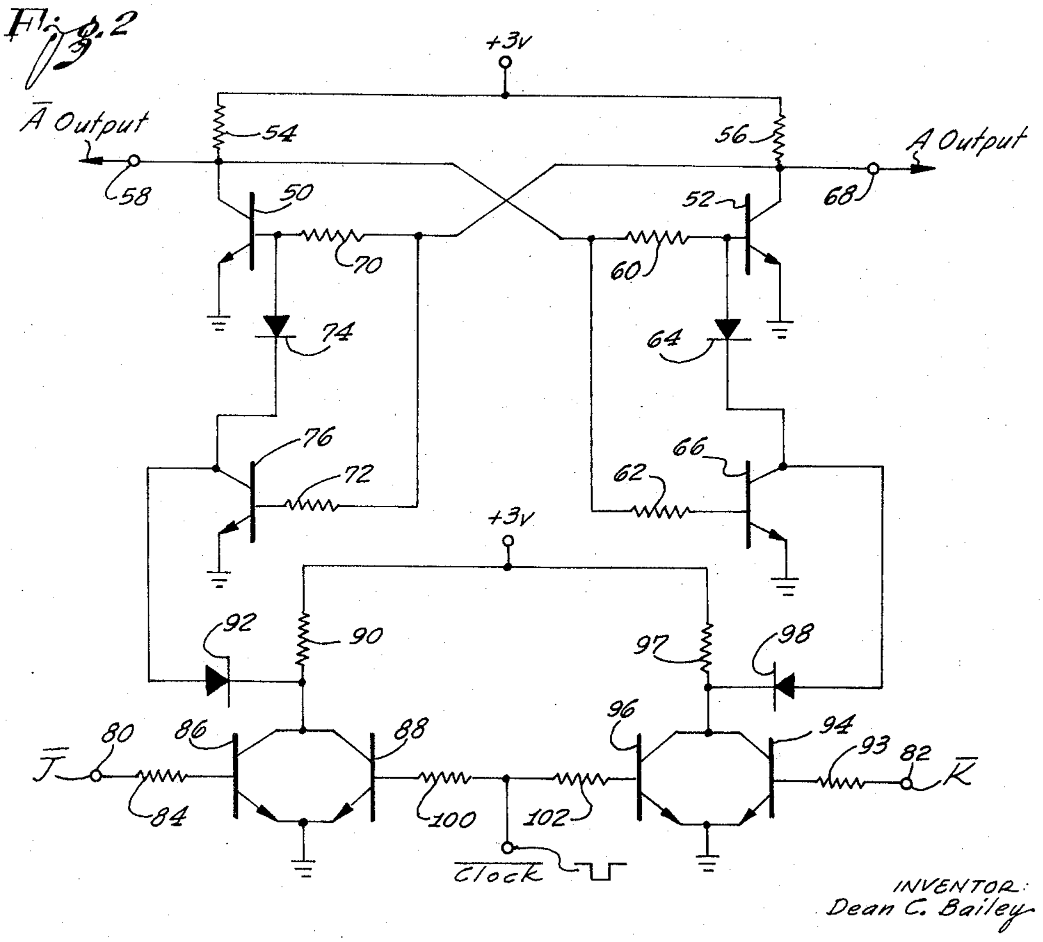
Figure 3:
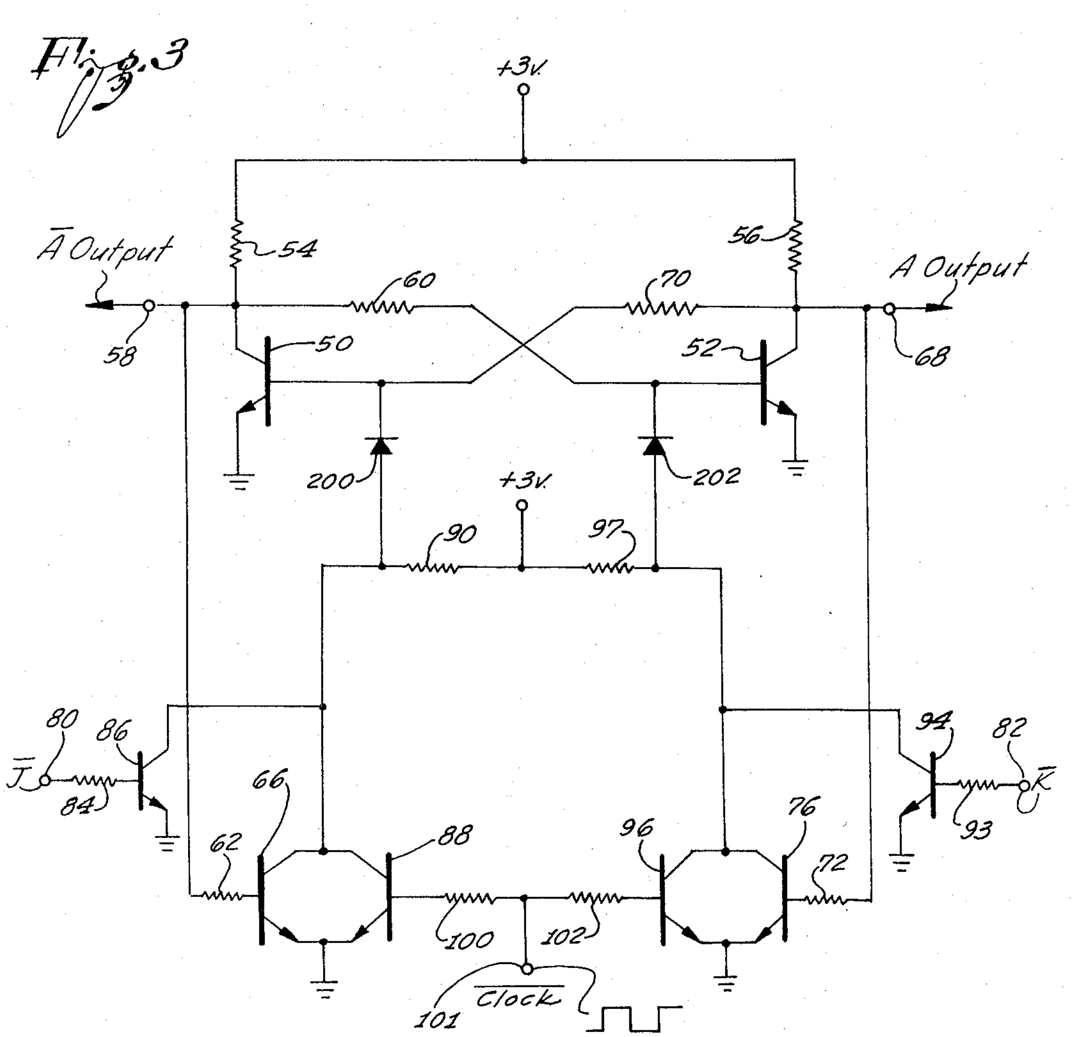

Other objects, features and advantages of the invention will become apparent from a consideration of the following description, when the description is taken in conjunction with the accompanying drawings, in which:

FIGURE 1 is a circuit diagram of a transistorized flip-flop circuit constructed in accordance with the concepts of one embodiment of the invention, and which is triggered by the trailing edge of the output waveform of a preceding flip-flop;

FIGURE 2 is a flip-flop circuit constructed in accordance with a second embodiment of the invention, and which is triggered by the trailing edge of a clock pulse applied to the circuit, as determined by the condition of other extraneous flip-flops; and FIGURE 3 is a flip-flop circuit constructed in accordance with yet another embodiment of the invention, the circuit of FIGURE 3 being similar in some respects to the circuit of FIGURE 2.

The flip-flop of FIGURE 1 includes a pair of NPN transistors 10 and 12. These transistors, and others to be described herein in conjunction with FIGURES 1, 2 or 3 may be of the silicon planar diffused junction type in a direct coupled transistor logic integrated circuit. The flip-flop includes additional NPN transistors 14 and 16 which also may be of the diffused junction type.

For integrated circuit construction, the transistors may be diffused on a semiconductor substrate, as mentioned. Certain diodes, to be described, may also be diffused on the substrate. It will be understood, however, that the flip-flop of FIGURE 1, and those to be described in conjunction with FIGURES 2 and 3, may be formed of standard circuit elements, if so desired.

The collector of the transistor 10 and the collector of the transistor 12 are connected to respective resistors 18 and 20 which, in turn, are connected, for example, to the positive terminal of a 3-volt direct voltage source. These resistors may each have a resistance of 200 ohms, for example. The collector of the transistor 10 is also connected to an output terminal 22 which is the "$\overline{A}$" output terminal of the flip-flop, and the collector of the transistor 12 is connected to an output terminal 24 which is the "A" output terminal of the flip-flop.

The emitters of the respective transistors 10 and 12 are grounded. The base of the transistor 10 is connected to the base of the transistor 14 and to the collector of the transistor 12. In like manner, the base of the transistor 12 is connected to the collector of the transistor 10 and to the base of the transistor 16. The transistors 14 and 16 are also of the NPN type in the illustrated embodiment. As shown, the emitters of these transistors are grounded. The collector of the transistor 14 is connected to a capacitor 30, and the collector of the transistor 16 is connected to a capacitor 32.

The capacitors 30 and 32 may each have a capacity, for example, of 100 micro-microfarads. The capacitors 30 and 32 are connected to the junction of a resistor 34 and the collector of a transistor 36. The resistor 34 may have a resistance, for example, of 200 ohms, and it is connected to the positive terminal of the 3-volt direct voltage source. The transistor 36 may be of the NPN type, and the emitter of the transistor is grounded.

The output from a previous like flip-flop, assuming that the flip-flop are connected in a counter configuration, is applied to the base of the transistor 36. The transistor 36 may also be of the diffused junction type constructed in accordance with integrated circuit techniques, and the capacitors 30 and 32 may be formed as diodes on the collector substrate of the transistor 36, as will be described in conjunction with the embodiments of FIGURES 2 and 3.

In the flip-flop of FIGURE 1, one of the capacitors 30 or 32 is charged by a current flow through the resistor 34 when the transistor 36 is rendered non-conductive. The transistor 36 is non-conductive when the applied output signal from the previous flip-flop is in its reset state.

The transistors 14 and 16 are connected in a manner such that they repeat the states of the basic flip-flop which is made up of the transistors 10 and 12 and associated circuitry. The transistors 14 and 16 provide the voltage levels required to provide adequate charge in the capacitors 30 and 32.

When the flip-flop is triggered to one of its two stable states, the transistors 12 and 16 are conductive, and the transistors 10 and 14 are non-conductive. Likewise, when the flip-flop is triggered to the other of its two stable states, the transistors 10 and 14 are conductive, and the transistors 12 and 16 are non-conductive.

The charging path for the capacitor 30 is through the transistor 14. Therefore, the charging path for the capacitor 30 is completed only when the flip-flop is in the state in which the transistors 10 and 14 are conductive. Likewise, the charging path for the capacitor 32 is completed only when the flip-flop circuit is in the state in which the transistors 12 and 16 are conductive.

Assuming that the flip-flop of FIGURE 1 is in a state in which the transistors 10 and 14 are conductive, the capacitor 30 will charge so long as the transistor 36 is non-conductive. That is, so long as the previous flip-flop is in its reset state. On the other hand, if the flip-flop circuit of FIGURE 1 is in a state in which the transistors 12 and 16 are conductive, the capacitor 32, rather than the capacitor 30 will assume a charge.

If it is arbitrarily assumed that the previous flip-flop in the counter or register is in a state such that transistor 36 is conducting (prior to the leading edge of the pulse shown applied to the base of transistor 36), then neither capacitor 30 nor capacitor 32 will charge and the junction of these two capacitors will be at approximately the $V_{CE(SAT)}$ of transistor 36. When, however, the previous flip-flop changes its state and the leading edge of the pulse shown in FIG. 1 is applied to the base of the input transistor 36, transistor 36 turns off and one of the capacitors 30 or 32 will begin to charge to approximately the three volt level of the voltage supply shown. For the condition where transistors 10 and 14 are conducting, capacitor 30 will charge through the collector and base regions of transistor 14 and through the base and emitter regions of transistor 10. With transistors 12 and 16 non-conducting there is no charge path for and no charging of capacitor 32. Therefore, upon the application of the negative-going leading edge of the input pulse to transistor 36, there is no change in the conductive state of the flip-flop with the charging of capacitor 30. However, when the base of transistor 36 sees the trailing edge of the pulse shown in FIG. 1 it again conducts and the potential at the collector of transistor 36 goes to approximately $V_{CE(SAT)}$. At this point, capacitor 30 discharges, pulling the charge out of the base of transistor 10, and the discharge path for capacitor 30 is from the base of transistor 10, through the base and collector regions of transistor 14 and into the left-hand plate of capacitor 30. As transistor 10 turns off, its rising collector potential is cross-coupled into the base of transistor 12, turning this transistor on to complete the bistable switching action of the flip-flop. Therefore, it can be seen that transistors 10 and 12 of FIG. 1 will alternate in their respective conductive states only after the base of transistor 36 sees the positive transition or the trailing edge of the input pulse.

If the flip-flop of FIG. 1 is initially in the state where transistors 12 and 16 are conducting, the capacitor 32 will be initially charged through the collector and base regions of transistor 16 and through the base and emitter regions of transistor 12 on the negative-going leading edge of the input pulse applied to the base of transistor 36. Then, as transistor 36 is turned on by the positive-going trailing edge of the input pulse, the charge will be rapidly pulled out of capacitor 32 as discharge current flows out of the base of transistor 12, and from the base and collector regions of transistor 16 to turn off transistors 12 and 16 and to turn on transistors 10 and 14.

The flip-flop of FIGURE 1 can be modified into the "J–K" type of flip-flop, such as shown in FIGURES 2 and 3. This latter type of flip-flop has a more general utility in computers and the like. The flip-flop of FIGURE 2 includes a pair of NPN transistors 50 and 52. The emitters of the transistors 50 and 52 are grounded. The collector of the transistor 50 is connected to a resistor 54, and the collector of the transistor 52 is connected to a resistor 56. Each of these resistors may have a resistance of 500 ohms, for example.

The resistors 54 and 56 are both connected to the positive terminal of a 3-volt direct voltage source, for example. The collector of the transistor 50 is also connected to the "$\overline{A}$" output terminal 58 of the flip-flop and to a pair of resistors 60 and 62. Each of these resistors, for example, may have a resistance of 200 ohms. The resistor 60 is connected to the base of the transistor 52 and to the anode of a diode 64. The resistor 62 is connected to the base of an NPN transistor 66. The emitter of the transistor 66 is grounded, and the collector is connected to the cathode of the diode 64.

The collector of the transistor 52 is also connected to an output terminal 68 which constitutes the "A" output terminal of the flip-flop. The collector of the transistor 52 is also connected to a pair of resistors 70 and 72. Each of these resistors may have a resistance of 200 ohms, for example. The resistor 70 is connected to the base of the transistor 50 and to the anode of a diode 74.

The resistor 72 is connected to the base of an NPN transistor 76. The emitter of the transistor 76 is grounded, and the collector is connected to the cathode of the diode 74.

The flip-flop of FIGURE 2 includes a first input terminal 80 to which an input designated $\bar{J}$ is applied, and it includes a second input terminal 82 to which an input designated $\bar{K}$ is applied. The input terminal 80 is connected through a resistor 84 to the base of an NPN transistor 86.

The NPN transistor 86, together with an NPN transistor 88 constitute an "and" gate. The emitters of these transistors are grounded, and their collectors are connected to a resistor 90 and to a reverse capacitance diode 92 which serves as a first charge storage means for the flip-flop. The resistor 90 is connected to the positive terminal of the 3-volt direct voltage source, for example.

The input terminal 82 is connected through a resistor 93 to the base of an NPN transistor 94. The transistor 94, together with a similar transistor 96 constitutes a second "and" gate. The emitters of the transistors 94 and 96 are grounded, and the collectors are connected to a resistor 97 and to a reverse capacitance diode 98. The diode 98 forms a second charge storage means for the flip-flop. The resistor 97 is connected to the positive terminal of the 3-volt direct voltage source, for example. The diode 98 is connected to the collector of the transistor 66, whereas the diode 92 is connected to the collector of the transistor 76. Each of the resistors 90 and 97 may have a resistance of 200 ohms, for example.

A single train of clock pulses designated $\overline{\text{clock}}$ are applied to an input terminal 101 and through respective resistors 100 and 102 to the base electrodes of the transistors 88 and 96. Each of the resistors 100 and 102 may, for example, have a resistance of 200 ohms.

The transistors 50 and 52 constitute the basic flip-flop transistors, and one of these transistors or the other is rendered conductive as the flip-flop is triggered between its set and reset state. As in the previous embodiment, the transistors 76 and 66 repeat the states of the transistors 50 and 52 respectively. These latter transistors provide a means of blocking the charging voltage of the capacitance diodes 92 and 98.

When the flip-flop is in one of its stable states, both the transistors 52 and 66 are conductive; and the transistors 50 and 76 are non-conductive. Conversely, when the flip-flop is in the other of its stable states, the transistors 50 and 76 are conductive, and the transistors 52 and 66 are non-conductive.

The resistors 60, 70, 62, 72, 93, 84, 100 and 102 are used to prevent "base current hogging" which is a detrimental effect encountered in the direct coupled transistor connection. The resistors can be provided by increasing the base spreading resistance ($r_b'$) of the transistors, and this can be accomplished in monolithical integrated circuits by simply modifying the geometry of the transistor. The diodes 64 and 74 provide low impedance paths to the respective base electrodes of the transistors 50 and 52 for the discharge current from the diodes 92 and 98; which paths bypass the aforementioned resistors.

The flip-flop of FIGURE 2 is triggered by the trailing edge of the clock pulses applied to the input terminal 101. As mentioned above, the prior art flip-flops generally use multi-phase trains of pulses for triggering purposes, with the leading edge of the pulses performing the actual triggering. In the flip-flop of FIGURE 3, the trailing edge of the clock pulse actually performs the triggering, and this results in a simplification in the over-all logic, as mentioned above, and overcomes any "race" tendencies.

The trailing edge triggering of FIGURE 2 is performed by sampling the input logic with each successive clock pulse, and by causing a capacitor to charge during the sampled time. At the end of the sampled time, and at the trailing edge of the clock pulse, if the particular capacitor has been charged, the charge is transferred into the flip-flop to change its state. However, if the capacitor has not been charged, the flip-flop remains in its same state.

In the circuit of FIGURE 2, the reverse capacitance diodes 92 and 98 perform the function of the capacitors which are charged during the sample time. The use of such diodes further facilitates the use of integrated circuit techniques, for they may be formed directly on the diffused collectors of the transistors 94, 96 or 86, 88. The diode 64 can be placed on the collector of the transistor 66, and the diode 74 can be placed on the collector of the transistor 76.

For example, if the flip-flop of FIGURE 2 is in the state, in which both the transistors 50 and 76 are conductive; then so long as the input $\bar{J}$ is low, during the occurrence of the negative transition of a clock pulse, both the transistors 86 and 88 will be rendered non-conductive, so that the diode 92 charges during the sample time interval of the clock pulse. At the same time, assuming that the input $\bar{K}$ is also low, there is a tendency for the diode 98 also to be charged during the sample interval. However, this latter charge is prevented, because of the fact that the transistor 66 is non-conductive and diode 64 is back-biased.

Then, upon the occurrence of the trailing edge of the clock pulse, the charged diode 92 is caused to discharge through the diode 74 into the base of the transistor 50, to reverse the state of the flip-flop.

Therefore, in accordance with a predetermined truth table, under the dependency of the particular state of the flip-flop of FIGURE 2, and of the inputs $\bar{J}$ and $\bar{K}$, the flip-flop of FIGURE 2 is triggered between its two stable states by the trailing edges of the clock pulses applied to the input terminal 101.

As mentioned above, flip-flop circuit of FIGURE 3 is generally similar to the circuit of FIGURE 2, and similar components have been designated by the same numbers. In the embodiment of FIGURE 3, the resistor 62 is connected to the collector of the transistor 50, and the transistor 66 is connected as an "and" gate with the transistor 88. Likewise, the resistor 72 is connected to the collector of the transistor 52, and the transistor 76 is connected as an "and" gate with the transistor 96.

The collectors of the transistors 86, 66 and 88 are connected to the anode of a forward storage diode 200, the cathode of which is connected to the base of the transistor 50. The collectors of the transistors 76, 94 and 96 are connected to the anode of a forward storage diode 202, the cathode of which is connected to the base of the transistor 52.

The circuit of FIGURE 3 is also well suited for integrated circuit construction. As is well known, forward storage diodes are formed by eliminating the usual gold doping step. Therefore, by the use of selective doping techniques the forward storage diodes 200 and 202 can be formed on the substrate.

The forward storage diodes 200 and 202 function as the charge storage means for the flip-flop of FIGURE 3. The major difference between the circuit of FIGURE 3 and that of FIGURE 2 is the use of the forward storage diodes 200 and 202 for the turn-off mechanism in the flip-flop of FIGURE 3, instead of the reverse capacitance diodes 64 and 74 used in the flip-flop of FIGURE 2.

The major advantage of using the forward storage diodes 200 and 202 instead of the reverse capacitance diodes 64 and 74 is that the amount of charge can be higher for a given physical area when integrated circuit techniques are used, and the voltage required to maintain the charge is controlled by the forward conductance of the diode. With the direct couled transistor logic type of integrated circuitry this is important, because such circuits generally operate at low supply voltages of the order of 2 or 3 volts, as shown in FIGURE 3.

Assuming that the flip-flop of FIGURE 3 is in the state such that the transistor 50 is conductive and the transistor 52 is non-conductive. During this state, the transistor 76 is conductive, so as to prevent any charge from being accumulated in the diode 202. However, the transistor 66 is non-conductive, so that a charging current may flow into the forward storage diode 200.

Assume now that the input $\overline{J}$ is low, so that the transistor 86 is non-conductive, then during the negative transition of a clock pulse applied to the terminal 101, the transistor 88 is rendered non-conductive so that a charge flows into the forward storage diode 200. The flow of this charging current also passes through the transistor 50 driving the transistor deeper into saturation.

Now, at the termination of the clock pulse applied to the terminal 101, and at its trailing edge, the transistor 88 is rendered conductive to establish a discharge path for the charge in the forward storage diode 200. This introduces a negative potential to the base of the transistor 50, removing the charge from the transistor 50 and causing it to become non-conductive. Therefore, the transistor 50 is rendered non-conductive and the flip-flop circuit is triggered to its alternate state in which the transistor 52 becomes conductive.

While either one of the forward storage diodes 200 or the diode 202 is charging, the other is clamped to ground by the collector of the associated transistor 76 or 66.

Therefore, the flip-flop of FIGURE 3, likewise, is triggered by the trailing edge of the clock pulses applied to the terminal 101. Each applied clock pulse itself establishes a sampling interval during which an associated charge storage means assumes a charge under certain conditions, after which the trailing edge of the clock pulse causes the flip-flop to change state, assuming that the inputs $\overline{J}$ and $\overline{K}$ are in pre-selected particular binary states.

The invention provides, therefore, improved flip-flops which find particular utility in the field of direct coupled transistor logic integrated circuitry. The improved flip-flops of the invention are advantageous in that they are susceptible for use in counter circuits, registers and the like, and when so used may be triggered in a properly timed manner without the need for multi-phase trains of triggering clock pulses, and extraneous logic or other circuitry.

While particular embodiments of the invention have been shown and described, modifications may be made, and it is intended in the claims to cover such modifications which fall within the spirit and scope of the invention.

What is claimed is:

1. In a bi-stable multivibrator circuit which includes first and second transistor means, and a cross-coupling network intercoupling said transistor means into a bi-stable circuit having a first stable state in which said first transistor means is conductive and a second stable state in which said second transistor means is conductive, circuit means coupled to said transistor means for introducing triggering signals thereto for switching the bi-stable circuit between its stable states, said circuit means including in combination: first and second capacitance means; charging circuit means coupled to said first and second capacitance means for introducing an electric charge thereto; said charging circuit means including third and fourth transistor means connected to said first and second capacitance means respectively and electrically coupled to and conductively controlled by said first and second transistor means for permitting a charging path to be completed only through a selected one of said first and second capacitance means when a corresponding one of said first and second transistor means is conducting.

2. The combination defined in claim 1 in which said circuit means includes an input transistor connected to a junction between said first and second capacitance means and conducting prior to the application of a leading edge of an input pulse thereto, said input transistor being turned off by said leading edge of said input pulse thereby causing only one of said first and second capacitance means to charge through said first and third transistor means and then to discharge when said input transistor is again turned on by the trailing edge of said input pulse, said discharge initiating a charge in conductive state of said first and second transistor means.

3. In a bi-stable multivibrator circuit which includes first and second transistor means, each having a base, an emitter and a collector, and a cross-coupling network intercoupling the bases and collectors of said transistor means into a bi-stable circuit having a first stable state in which said first transistor means is conductive and a second stable state in which said second transistor means is conductive, circuit means including respective diode means coupled to the bases of said transistor means for introducing triggering signals thereto for switching the bi-stable circuit between its stable states, said circuit means including in combination: first and second capacitance means; third and fourth transistor means connected to said first and second capacitance means and to the first and second transistor means; said third and fourth transistor means having their conductive states controlled by the conductive states of said first and second transistor means respectively and thereby providing a charge and discharge path for said first and second capacitance means into and out of the bases of said first and second transistor means only when said first and second transistor means are conducting.

4. The combination of claim 3 wherein said first and second capacitance means include first and second diodes connected to said third and fourth transistor means and further connected to input logic circuitry for receiving therefrom a charging voltage, said first and second diode means operative to charge and discharge only when said first and second transistor means are conducting and thereby providing a charge and discharge path through said first and third transistor means.

5. The combination defined in claim 4 wherein said input logic circuitry includes first and second emitter-coupled transistor pairs connected respectively to said first and second diodes and further connected to receive binary information and thereby provide a charging voltage at said first and second diodes, said first diode only being charged through said first and third transistor means on the leading edge of binary pulse information applied to said first emitter-coupled transistor pair and being discharged by the trailing edge of binary pulses applied to said first emitter-coupled transistor pair to initiate a change in the conductive state of said multivibrator.

6. In a bistable multivibrator which includes first and second transistors each having an emitter, a base and a collector and which are cross-coupled in a bistable circuit configuration having a first stable state in which said first transistor is conducting and a second stable state in which said second transistor is conductive, the improvement comprising a triggering circuit including third and fourth transistors each having an emitter, a base and a collector, said third and fourth transistors connected to said first and second transistors, respectively, and biased conducting when said first and second transistors are conducting, first and second capacitors connected between said third and fourth transistors respectively and to a common circuit input point for receiving binary voltage transitions at said input point, said first capacitor being charged through said first and third transistors when said first and third transistors are conducting and said second capacitor being charged through said second and fourth transistors when second and fourth transistors are conducting; a charging voltage at said input point and produced by the leading edge of an input pulse applied to said triggering circuit will charge said first capacitor through said first and third transistors, driving said first transistor into saturation on the leading edge of said input pulse, said first capacitor being rapidly discharged on the trailing edge of said input pulse and said first and third transistors being turned off only when said first capacitor is discharged, thereby causing said second and fourth transistors to be turned on to change the conductive state of said flip-flop only after the occurrence of the trailing edge of said input pulse.

7. In a bistable multivibrator circuit which includes first and second transistors each having an emitter, a base and a collector, and cross-coupled in a bistable circuit configuration having a first stable state in which the first transistor is conducting and a second stable state in which the second transistor is conducting, the improvement comprising a triggering circuit including a third transistor having an emitter, a base and a collector and connected at the base thereof to the base of said first transistor and biased conducting when said first transistor is conducting, a fourth transistor having an emitter, a base and a collector and connected at the base thereof to the base of said second transistor and biased conducting when said second transistor is conducting, a first input logic circuit connected to receive binary logic signals and having a current input point resistively connected to a supply voltage, a first reverse-capacitance diode connected between said current input point of said first logic circuit and said third transistor and adapted to be charged and discharged by a charging voltage at said current input point of said first logic circuit only when said first and third transistors are conducting, a second input logic circuit having a current input point resistively connected to said supply voltage, a second reverse-capacitance diode connected between said current input point of said second logic circuit and said fourth transistor and adapted to be charged and discharged only when said second and fourth transistors are conducting, the conduction of said third and fourth transistors being necessary to complete a charge and discharge path from said first and second reverse-capacitance diodes, whereby said first and second reverse-capacitance diodes may be charged and discharged when logic signals at a predetermined level are concurrently applied to said first and second logic circuits.

8. The combination according to claim 7 wherein: said first and second logic circuits include first and second logic gates comprising emitter-coupled transistor pairs connected in parallel to receive binary logic information, said first and second reverse-capacitance diodes connected respectively between the collectors of said third and fourth transistors and the collectors of said first and second transistor pairs, and third and fourth diodes connected between said bases of said first and second transistors and the collectors of said third and fourth transistors to provide an additional charge and discharge path for said first and second reverse-capacitance diodes.

9. In a bistable multivibrator circuit which includes first and second transistors each having an emitter, a base and a collector and cross-coupled in a bistable circuit configuration wherein the first transistor is conductive and the second transistor is non-conductive in the first stable state of the multivibrator and the second transistor is conductive and said first transistor is non-conductive in the second stable state of said multivibrator, the improvement comprising, in combination: triggering circuit means coupled to said multivibrator for introducing triggering signals thereto for switching the bistable multivibrator between its two stable states, said triggering circuit means including first and second input logic gates each resistively coupled to a voltage supply at a common current input point and connected to receive binary logic signals for causing voltage variations at said each input point, a first forward-storage diode connected between said current input point of said first logic gate and said first transistor in said bistable multivibrator, a second forward-storage diode connected between said current input point of said second logic gate and said second transistor in said bistable multivibrator, said first and second forward-storage diodes being alternately charged and clamped to ground potential as the voltage levels at the current input points of said first and second logic gates are alternately raised and lowered by binary logic signals applied thereto whereby said first forward-storage diode will charge through said first transistor when the voltage at the current input point of said first logic gate rises under predetermined binary logic signal conditions to drive said first transistor into saturation and will be discharged on the trailing edge of a binary logic signal applied to said first logic gate, turning off said first transistor and turning on said second transistor.

10. The multivibrator in accordance with claim 9 wherein: said first and second logic gates include first and second emitter-coupled transistor pairs having their collector-emitter paths connected in parallel and the collectors of each pair connected at said common current input points respectively, said common current input points of each emitter-coupled pair resistively connected to a supply voltage, said first and second forward-storage diodes connected between said current input points of each emitter-coupled transistor pairs respectively and the bases of said first and second transistors for providing a charge path into said first and second transistors during an increase in voltage at said first and second input points, first and second circuit means connecting the collectors of said first and second transistors to the base of one transistor in each emitter-coupled pair to thereby control the conductive state of said one transistor in each transistor pair in accordance with the conductive state of said first and second transistors respectively, the other transistor in each emitter-coupled transistor pair resistively coupled to a source of clock signals for controlling the conductive state of the other transistor in each emitter-coupled transistor pair, third and fourth transistors having their collector-emitter paths connected in parallel respectively with said first and second emitter-coupled transistor pairs and connectable to sources of J and K binary information respectively, whereby upon a given sequence of clock signals and J and K binary information to said emitter-coupled transistors, the first or second forward storage diodes will be charged into said first or second transistors on the leading edge of clock pulses and will be discharged upon the trailing edge of said clock pulses to initiate a change in conductive state of said multivibrator only on the trailing edge of said clock pulses.

References Cited by the Examiner

UNITED STATES PATENTS

| | | | |
|---|---|---|---|
| 2,939,969 | 6/1960 | Kwapp et al. | 307—88.5 |
| 2,945,965 | 7/1960 | Clark | 307—88.5 |
| 3,042,813 | 7/1962 | Johnson | 307—88.5 |
| 3,045,128 | 7/1962 | Skerritt | 307—88.5 |
| 3,046,413 | 7/1962 | Clapper | 307—88.5 |
| 3,069,565 | 12/1962 | Van Ness | 307—88.5 |

ARTHUR GAUSS, *Primary Examiner.*

J. JORDON, *Assistant Examiner.*